US010134979B1

(12) United States Patent
Kawakami et al.

(10) Patent No.: US 10,134,979 B1
(45) Date of Patent: Nov. 20, 2018

(54) STRONTIUM OXIDE AS A TUNNEL BARRIER FOR SPIN INJECTION AND GIANT SPIN ACCUMULATION

(71) Applicant: Ohio State Innovation Foundation, Columbus, OH (US)

(72) Inventors: Roland K. Kawakami, Columbus, OH (US); Simranjeet Singh, Columbus, OH (US); Jyoti Katoch, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 15/631,825

(22) Filed: Jun. 23, 2017

(51) Int. Cl.
| | | |
|---|---|---|
| H01L 43/10 | (2006.01) | |
| H01F 10/16 | (2006.01) | |
| H01L 43/08 | (2006.01) | |
| H01F 10/32 | (2006.01) | |
| H03K 19/16 | (2006.01) | |
| H03K 19/21 | (2006.01) | |
| G11C 11/16 | (2006.01) | |

(52) U.S. Cl.
CPC ............ *H01L 43/10* (2013.01); *G11C 11/161* (2013.01); *G11C 11/1673* (2013.01); *H01F 10/16* (2013.01); *H01F 10/3204* (2013.01); *H01L 43/08* (2013.01); *H03K 19/16* (2013.01); *H03K 19/21* (2013.01)

(58) Field of Classification Search
CPC ......... H01L 43/10; H01L 43/08; H01F 10/16; H01F 10/3204; H03K 19/16; H03K 19/21; G11C 11/161; G11C 11/1673
See application file for complete search history.

(56) References Cited

U.S. PATENT DOCUMENTS

| 2003/0151944 A1* | 8/2003 | Saito | ................ G11C 11/15 365/173 |
| 2004/0100855 A1* | 5/2004 | Saito | ................ B82Y 10/00 365/232 |
| 2007/0019463 A1* | 1/2007 | Saito | ................ G11C 11/16 365/158 |
| 2015/0085569 A1* | 3/2015 | Nozaki | ............ H01L 29/66984 365/158 |

(Continued)

OTHER PUBLICATIONS

Behin-Aein, Behtash et al., "Proposal for an all-spin logic device with built-in memory," Nature Nanotechnology, vol. 5, Apr. 2010, Macmillan Publishers Limited, pp. 266-270.

(Continued)

*Primary Examiner* — Vu Le
*Assistant Examiner* — Sung Cho
(74) *Attorney, Agent, or Firm* — Withrow & Terranova, P.L.L.C.

(57) ABSTRACT

A spintronic device is disclosed. The spintronic device includes a spin current transport layer, a spin injector, and a spin detector. The spin injector includes a first tunnel barrier layer made of strontium oxide (SrO) disposed over the spin current transport layer and a first magnetic material layer disposed over the first tunnel barrier layer. The spin detector includes a second tunnel barrier layer made of SrO disposed over the spin current transport layer. A second magnetic material layer is disposed over the second tunnel barrier layer and a spin sensor has a sensor input terminal coupled to the second magnetic material layer.

19 Claims, 5 Drawing Sheets

(56) References Cited

U.S. PATENT DOCUMENTS

2016/0173100 A1* 6/2016 Nikonov ........... H01L 29/66984
                                                     326/38
2016/0276404 A1* 9/2016 Nakamura ............ H01L 27/222
2017/0363606 A1* 12/2017 Kikitsu .............. G01N 21/6428

OTHER PUBLICATIONS

Nieumann, I. et al., "Enhanced spin accumulation at room temperature in graphene spin valves with amorphous carbon interfacial layers," Applied Physics Letters, vol. 103, Issue 11, Jun. 15, 2015, AIP Publishing LLC, pp. 1-11.

* cited by examiner

STRONTIUM OXIDE AS A TUNNEL BARRIER FOR SPIN INJECTION AND GIANT SPIN ACCUMULATION

GOVERNMENT SUPPORT

This invention was made with government funds under Agreement No. HR0011-13-3-0002 awarded by The Defense Advanced Research Projects Agency (DARPA). The U.S. Government has certain rights in this invention.

FIELD OF THE DISCLOSURE

The present disclosure relates to an improved tunnel barrier spin injector and spintronic devices based thereon.

BACKGROUND

A major challenge facing an advancing electronics industry is high power dissipation that results in undesirable heating of electronic devices and unsatisfactory battery drain in portable electronic devices such as smartphones. Spin transport electronics (spintronics) is a relatively new field of electronics that offers advantages over traditional electronics in power dissipation, non-volatility, and speed. These advantages exist because spintronics convey information by electron spin instead of the charge magnitude that is used to convey information in traditional electronics.

Key processes used to convey information through spintronic devices include spin injection, spin transport, and spin switching. Spin injection generates a common spin polarization for a group of electrons and injects the spin polarized group of electrons into a spin transport layer to input a magnetic data bit. Spin transport occurs as the spin polarized group of electrons propagates through the spin transport layer that is made of an electrically conductive material. Spin switching occurs when the spin polarized group of electrons arrives at a detector that writes the spin polarization of the spin polarized group of electrons into a magnetization state of an output magnetic data bit.

The effectiveness of these key processes is in spin accumulation and spin current magnitude. A tunnel barrier layer made of a tunnel barrier material that is spin injection efficient is critical for realizing improved spin injection. Therefore, what is needed is an improved tunnel barrier-based spin injector having a tunnel barrier layer made of a tunnel barrier material that has greater spin injection efficiency than traditional tunnel barrier materials such as magnesium oxide (MgO).

SUMMARY

A spintronic device is disclosed. The spintronic device includes a spin current transport layer, a spin injector, and a spin detector. The spin injector includes a first tunnel barrier layer made of strontium oxide (SrO) disposed over the spin current transport layer and a first magnetic material layer disposed over the first tunnel barrier layer. The spin detector includes a second tunnel barrier layer made of SrO disposed over the spin current transport layer. A second magnetic material layer is disposed over the second tunnel barrier layer and a spin sensor has a voltage input terminal coupled to the second magnetic material layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
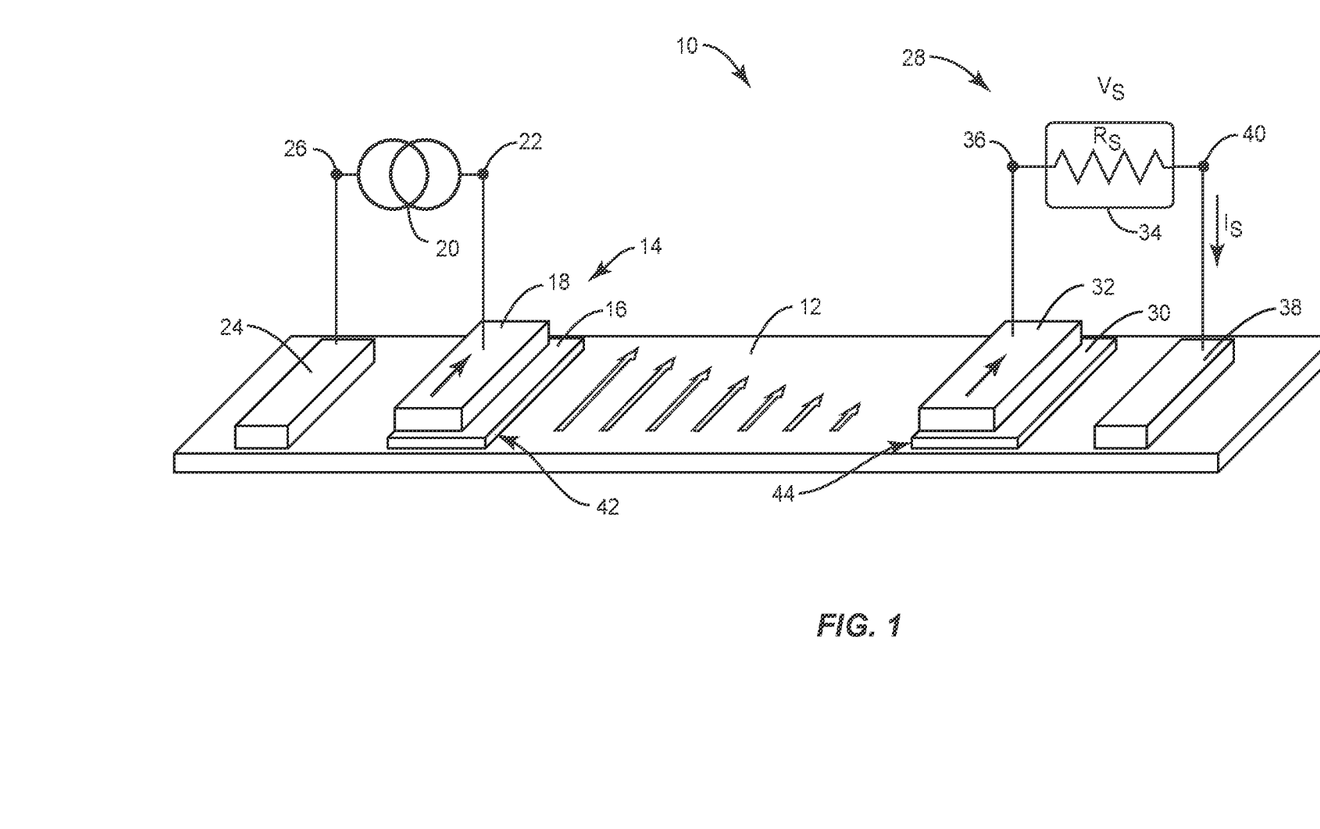
FIG. 1 is a diagram of a spintronic device that is structured in accordance with the present disclosure.

FIG. 1 depicts a spintronic device 10 that is in accordance with the present disclosure. The spintronic device 10 includes a spin current transport layer 12 that is made of an electrically conductive material that forms a spin transport channel. In at least some exemplary embodiments, the spin current transport layer 12 is made of single-layer graphene. However, it is to be understood that the spin current transport layer 12 can also be made of few-layer graphene, which in the context of this disclosure is a number of graphene layers stacked atop one another that retains properties that are unique to graphene in comparison to graphite.

The spintronic device 10 further includes a spin injector 14 that is comprised of a tunnel barrier layer 16 made of strontium oxide (SrO). The tunnel barrier layer 16 is disposed over the spin current transport layer 12, and in at least some embodiments, tunnel barrier layer 16 is disposed directly onto the spin current transport layer 12 without any intervening layers. In an exemplary embodiment, the SrO is a crystalline (001) oriented film that is directly disposed on a single layer of graphene that makes up the spin current transport layer 12 in the exemplary embodiment. In yet other exemplary embodiments the SrO is amorphous. Moreover, in exemplary embodiments, the SrO making up the tunnel barrier layer 16 has a thickness of from 0.8 nanometers (nm) to 4 nm. In yet other exemplary embodiments, the SrO making up the tunnel barrier layer 16 has a thickness of from 4 nm to 10 nm.

The spin injector 14 also includes a magnetic material layer 18 that is disposed over the tunnel barrier layer 16. In at least some embodiments, the magnetic material layer 18 is disposed directly onto the tunnel barrier layer 16 without any intervening layers. In some embodiments, the magnetic material layer 18 is ferrimagnetic, and in other embodiments, the magnetic material layer is ferromagnetic. In at least one exemplary embodiment, the magnetic material layer 18 is made of cobalt (Co).

An electron current source 20 has a current output terminal 22 coupled to the magnetic material layer 18. An electrode 24 is disposed over the spin current transport layer 12 and in at least some embodiments is directly disposed onto the spin current transport layer 12 without any intervening layers. The electrode 24 is made of an electrically conductive material such as gold (Au). The electrode 24 is coupled to a current input terminal 26 of the current source 20.

In an exemplary embodiment, the spin injector 14 is configured to inject a spin current $I_S$ having a magnitude of at least 10 microamperes per meter square into the spin current transport layer 12. In this exemplary embodiment, an upper bound for injected spin current $I_S$ is 300 microamperes. In yet other embodiments, the spin injector 14 and the spin current transport layer 12 are configured to achieve a spin relaxation time of at least 2 nanoseconds for an injected spin current $I_S$ of 10 microamperes per meter square. The injected spin current $I_S$ is represented by flat arrows depicted on the surface of the spin current transport layer 12. The injected spin current $I_S$ diminishes in magnitude as it propagates away from the spin injector 14.

The spintronic device 10 further includes a spin detector 28 that is spaced from the spin injector 14. The spin detector 28 includes a second tunnel barrier layer 30 made of SrO. Similar to the tunnel barrier layer 16, the second tunnel barrier layer 30 is disposed over the spin current transport layer 12, and in at least some embodiments, second tunnel barrier layer 30 is disposed directly onto the spin current transport layer 12 without any intervening layers. As with one of the exemplary embodiments of the spin injector 14, the SrO is a crystalline (001) oriented film that is directly disposed on a single layer of graphene that makes up the spin current transport layer 12. In yet other exemplary embodiments, the SrO is amorphous. Moreover, in exemplary embodiments, the SrO making up the second tunnel barrier layer 30 has a thickness of from 0.8 nanometers (nm) to 4 nm. In yet other exemplary embodiments, the SrO making up the second tunnel barrier layer 30 has a thickness of from 4 nm to 10 nm.

The spin detector 28 also includes a second magnetic material layer 32 that is disposed over the second tunnel barrier layer 30. In at least some embodiments, the second magnetic material layer 32 is disposed directly onto the second tunnel barrier layer 30 without any intervening layers. In some embodiments, the second magnetic material layer 32 is ferrimagnetic, and in other embodiments, the second magnetic material layer 32 is ferromagnetic. In at least one exemplary embodiment, the second magnetic material layer 32 is made of Co.

A spin sensor 34 has a sensor input terminal 36 coupled to the second magnetic material layer 32. A second electrode 38 is disposed over the spin current transport layer 12. The second electrode 38 is made of an electrically conductive material such as Au. The second electrode 38 is coupled to a reference terminal 40 of the spin sensor 34. In at least one embodiment, the spin sensor 34 is a resistor $R_S$ across which a sensor voltage $V_S$ is developed as an injected spin signal current $I_S$ flows between the sensor input terminal 36 and the reference terminal 40.

In an exemplary embodiment, a spin channel length defined as a distance between a first edge 42 of the tunnel barrier layer 16 and a second edge 44 of the second tunnel barrier layer 30 is at least 3 micrometers (μm). In the exemplary embodiment, an upper bound for the distance between the first edge 42 of the tunnel barrier layer 16 and the second edge 44 of the second tunnel barrier layer 30 is 90 µm. In another exemplary embodiment, the spin injector 14 is configured to produce an accumulation voltage of at least 2 mV at the spin sensor 34 for a spin current IS of 100 microamperes for a spin channel length between the spin injector 14 and the spin detector 28 of 1 µm. Moreover, the spin injector 14 is configured to produce a spin accumulation voltage of at least 2 mV at the spin sensor 34 for a spin current of 100 microamperes per meter square for a spin channel length of 2 µm.

Figure 2:
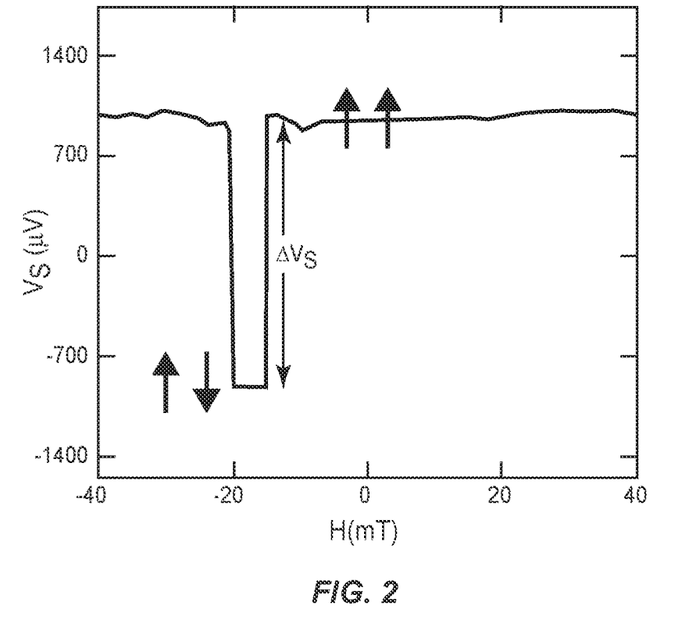
FIG. 2 is a graph of sensor voltage $V_S$ versus a magnetic flux sweep for a first parallel magnetization state and a first antiparallel magnetization state between the first magnetic layer and a second magnetic layer.
Figure 3:
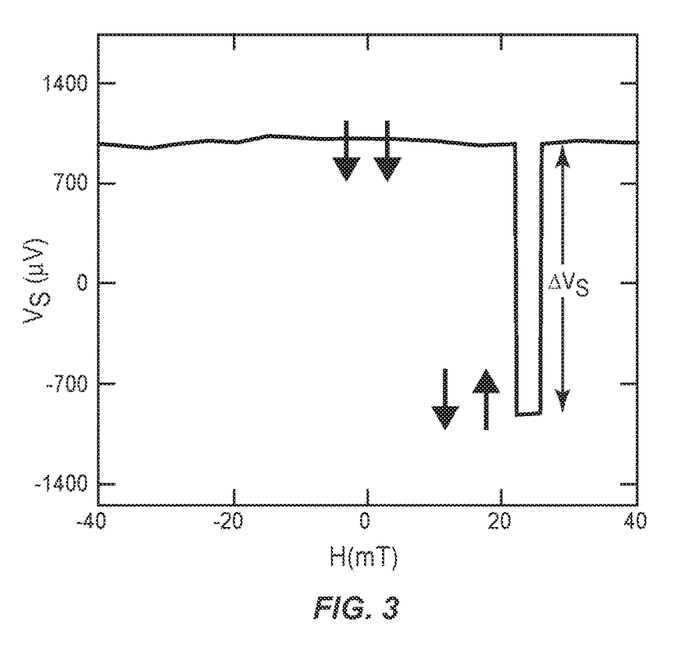
FIG. 3 is a graph of sensor voltage $V_S$ versus a magnetic flux sweep for a second parallel magnetization state and a second antiparallel magnetization state between the first magnetic layer and the second magnetic layer.

FIG. 2 is a graph of sensor voltage $V_S$ versus a magnetic flux sweep for a first parallel magnetization state and a first antiparallel magnetization state between the magnetic material layer 18 (FIG. 1) and the second magnetic material layer 32. FIG. 3 is a graph of sensor voltage $V_S$ versus the magnetic flux sweep for a second parallel magnetization state and a second antiparallel magnetization state between the magnetic material layer 18 and the second magnetic material layer 32. Solid black arrows depicting the magnetic material layer 18 and the second magnetic material layer 32 represent the relative directions of the first and second magnetization states for both parallel and antiparallel magnetization directions in both FIG. 2 and FIG. 3. The direction of either magnetization is reversible by way of external magnetic fields (not shown).

Both FIG. 2 and FIG. 3 provide exemplary demonstrations of giant spin accumulations that are produced by the spin injector 14. FIG. 2 depicts a non-local $\Delta V_S$ of at least 1600 mV at −20 millitesla (mT) as magnetic flux is swept from −40 mT to +40 mT. FIG. 3 depicts a similar magnitude of non-local $\Delta V_S$ near +20 mT as magnetic flux is swept from −40 mT to +40 mT.

Figure 4:
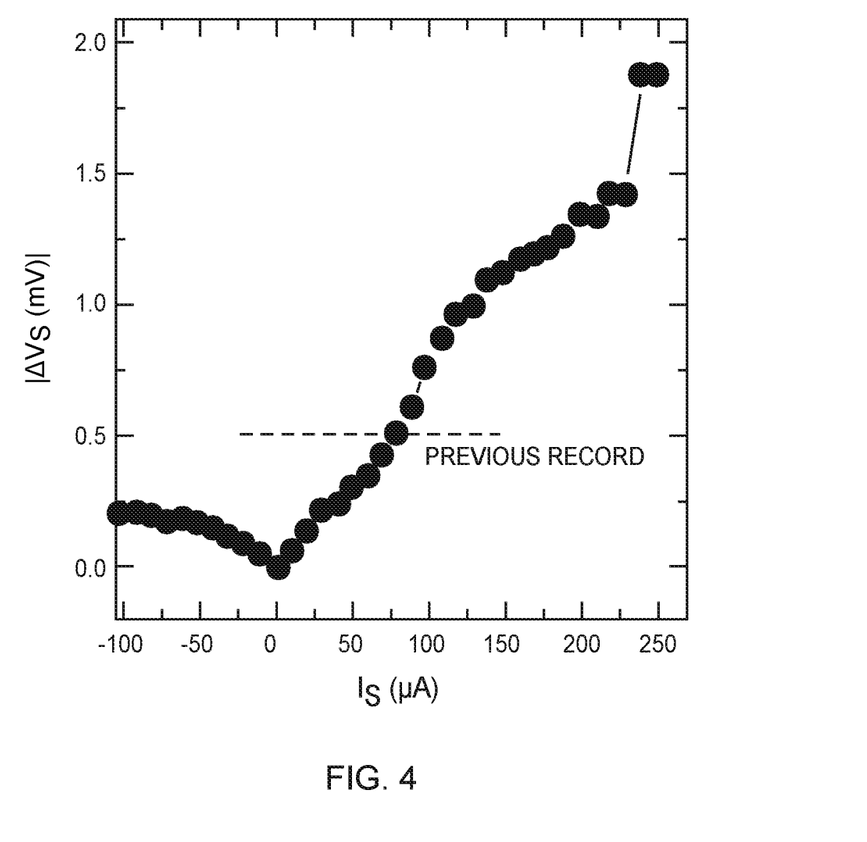
FIG. 4 is a graph of change in sensor voltage $\Delta V_S$ versus injected spin current $I_S$ for the spintronic device of FIG. 1.

FIG. 4 is a graph of change in sensor voltage $\Delta V_S$ versus injected spin current $I_S$ for the spintronic device 10 of FIG. 1. Spin accumulation indicated by accumulation voltage increases as magnitude of injected spin current $I_S$ increases. As illustrated by the graph of FIG. 4, the SrO making up the tunnel barrier layer 16 and the second tunnel barrier layer 30 provides a spin injection efficiency that leads to giant spin accumulations that are four times higher than the previous record of 0.5 mV. In fact, the present SrO-based spintronic device 10 achieves a change in sensor voltage $\Delta V_S$ of 2.0 mV.

Figure 5:
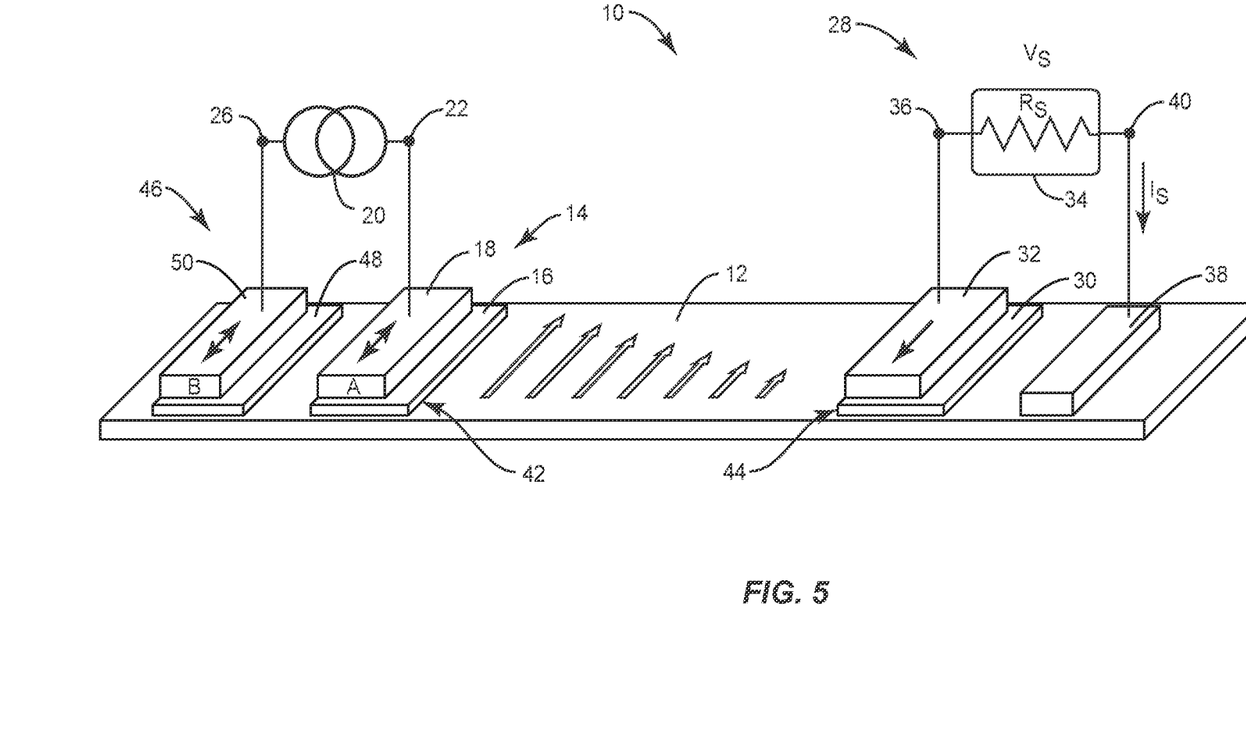
FIG. 5 is an embodiment of the spintronic device that further includes a second spin injector spaced from a first spin injector and a spin detector and configured as a spin logic gate.

FIG. 5 is a magnetologic gate embodiment of the spintronic device 10 that further includes a second spin injector 46 spaced from the first spin injector 14 and the spin detector 28. In this particular exemplary embodiment, the spintronic device 10 is configured as an exclusive OR (XOR) logic gate. However, it is to be understood that the spintronic device 10 is not limited to a particular logic gate type. Instead, those skilled in the art will recognize that the spintronic device 10 can be expanded to realize other types of combinational logic gates used to perform logic functions such as AND, OR, NAND, and NOR. Moreover, the spintronic device 10 can be expanded to create sequential logic and basic memory blocks.

In the particular embodiment of FIG. 5, the second spin injector 46 replaces the electrode 24 shown in FIG. 1. The second spin injector 46 includes a third tunnel barrier layer 48 disposed over the spin current transport layer 12. As shown in FIG. 5, the third tunnel barrier layer 48 is disposed directly onto the spin current transport layer 12 without any intervening layers. However, it is to be understood that in some cases intervening layers can be sandwiched between the tunnel barrier layer 16, the second tunnel barrier layer 30, and the third barrier layer 48 and the spin current transport layer 12 while remaining within the scope of the disclosure.

The third tunnel barrier layer 48 is made of SrO and with a layer thickness range that is equal to that of the tunnel barrier layer 16. A third magnetic material layer 50 is disposed over the third tunnel barrier layer 48. The third magnetic material layer 50 is disposed directly onto the third tunnel barrier layer 48 without any intervening layers. However, it is to be understood that in some cases intervening layers can be sandwiched between the third tunnel barrier layer 48 and the third magnetic material layer 50 without falling outside the scope of the disclosure.

In the particular exemplary embodiment of FIG. 5, the third magnetic material layer 50 is coupled to the current input terminal 22 of the electron current source 20. Also, the third magnetic material layer 50 is made of the same magnetic material that makes up the magnetic material layer 18, which in an exemplary case is Co. The thickness of the Co ranges from between 20 nm and 80 nm for each of the magnetic material layer 18, the second magnetic material layer 32, and the third magnetic material layer 50.

In FIG. 5, the first spin injector 14 is configured to inject a first spin current into the spin current transport layer 12 to create a first magnetic data bit in response to a first logic signal A. The second spin injector 46 is configured to inject a second spin current into the spin current transport layer 12 to create a second magnetic data bit in response to a second logic signal B. The spin detector 28 is configured to output a resultant logic signal X in response to the first magnetic data bit and the second magnetic data bit. However, it is to be understood that the spin device 10 is expandable to respond to any finite number of logic signal inputs and provide any finite number of logic signal outputs.

Figure 6:
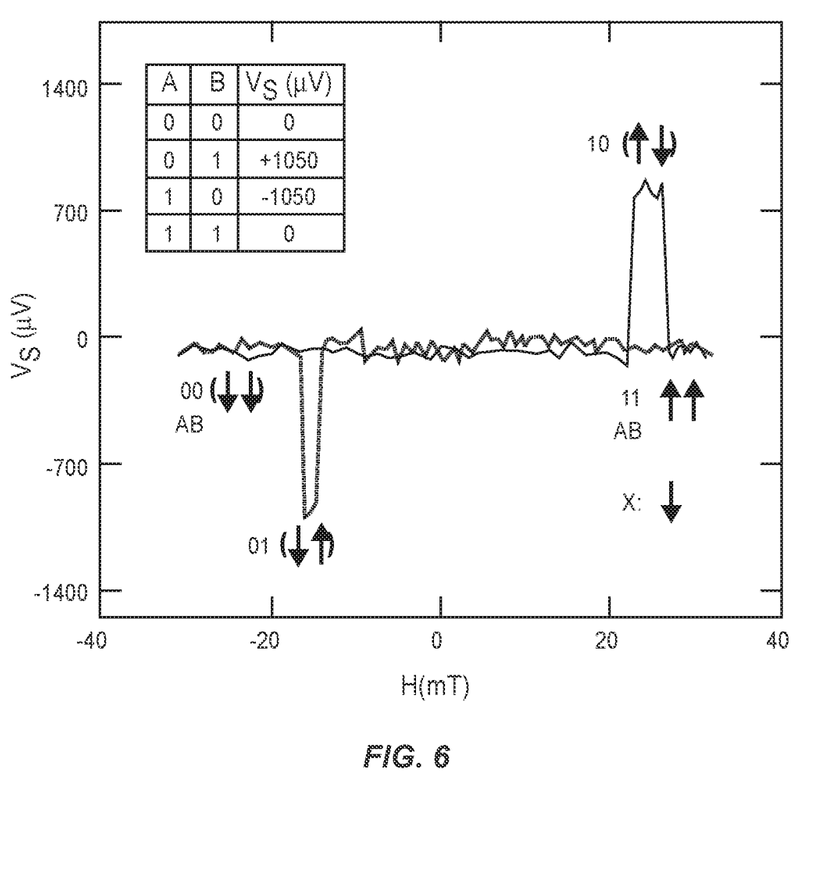
FIG. 6 is a graph of resultant signals for the XOR function of the spintronic device as depicted in FIG. 5.

FIG. 6 is a graph of resultant signals for the XOR function of the spintronic device 10 as depicted in FIG. 5. FIG. 6 also includes an inset of a logic truth table for the spintronic device 10 in the XOR function configuration. As further shown in FIG. 6, four different input states are realized by sweeping an external magnetic field H that is collinear with an easy axes of the magnetic material layer 18, the second magnetic material layer 32, and the third magnetic material layer 50. The sweeping of the external magnetic field H is performed to switch individually the magnetizations of A and B inputs to the first spin injector 14 and the second spin injector 46, which each has a different magnetic shape anisotropy. The magnetization of second magnetic material layer 32 (i.e., X signal) is kept downward during the logic operation. The measured spin voltage $V_S$ varies with the different input states and demonstrates the XOR logic operation.

However, it is to be understood that the spintronic device 10 (FIG. 1) is not limited to a particular logic gate type. Instead, those skilled in the art will recognize that the spintronic device 10 can be expanded to realize other types of combinational logic gates used to perform logic functions such as AND, OR, NAND, and NOR. Moreover, the spintronic device 10 can be expanded to create sequential logic and basic memory blocks. As such, those skilled in the art will recognize improvements and modifications to the preferred embodiments of the present disclosure. All such improvements and modifications are considered within the scope of the concepts disclosed herein and the claims that follow.

What is claimed is:
1. A spintronic device comprising:
a spin current transport layer;

a first spin injector comprising:
  a first tunnel barrier layer made of strontium oxide (SrO) disposed over the spin current transport layer;
  a first magnetic material layer disposed over the first tunnel barrier layer; and
a spin detector comprising:
  a second tunnel barrier layer made of SrO disposed over the spin current transport layer;
  a second magnetic material layer disposed over the second tunnel barrier layer; and
  a spin sensor having a spin input terminal coupled to the second magnetic material layer, wherein the spin injector and the spin transport layer are configured to achieve a spin relaxation time of at least 2 nanoseconds for an injected spin current of 10 microamperes per meter square.

2. The spintronic device of claim 1 further including an electron current source having a first current output terminal coupled to the first magnetic material layer.

3. The spintronic device of claim 2 further comprising:
  a first electrode coupled to a current input terminal of the electron current source, wherein the first electrode is disposed over the spin current transport layer; and
  a second electrode disposed over the spin current transport layer, wherein the second electrode is coupled to a reference terminal of the spin sensor.

4. The spintronic device of claim 1 wherein the spin current transport layer is made of graphene.

5. The spintronic device of claim 1 wherein the first magnetic material layer and second magnetic material layer are made of a ferromagnetic material.

6. The spintronic device of claim 5 wherein the ferromagnetic material is cobalt (Co).

7. The spintronic device of claim 1 wherein the first magnetic material layer and the second magnetic material layer are made of a ferrimagnetic material.

8. The spintronic device of claim 1 wherein the SrO is crystalline.

9. The spintronic device of claim 8 wherein the SrO is a (001) oriented film disposed directly onto the graphene.

10. The spintronic device of claim 1 wherein the SrO is amorphous.

11. The spintronic device of claim 1 wherein the SrO has a thickness of from 0.8 nanometers (nm) to 4 nm.

12. The spintronic device of claim 1 wherein a distance between a first edge of the first tunnel barrier layer and a second edge of the second tunnel barrier layer facing the first edge is at least 3 micrometers (μm).

13. The spintronic device of claim 1 wherein the first spin injector is configured to produce a spin accumulation voltage of at least 2 mV at the spin sensor for a spin current of 100 microamperes per meter square for a spin channel length between the first spin injector and the spin detector of 2 μm.

14. The spintronic device of claim 1 further including at least a second spin injector spaced from the first spin injector and the spin detector and configured as a spin logic gate wherein:
  the first spin injector is configured to inject a first spin current into the spin current transport layer to create a first magnetic data bit in response to a first logic signal;
  the at least second spin injector is configured to inject another spin current into the spin current transport layer to create at least one other magnetic data bit in response to at least one other logic signal; and
  the spin detector is configured to output a resultant logic signal in response to the first magnetic data bit and the at least one other magnetic data bit.

15. The spintronic device of claim 14 wherein the spin logic gate is configured to perform an XOR logic function.

16. The spintronic device of claim 14 wherein the spin logic gate is configured to perform an AND logic function.

17. The spintronic device of claim 14 wherein the spin logic gate is configured to perform an OR logic function.

18. The spintronic device of claim 14 wherein the spin logic gate is configured to perform a NAND logic function.

19. The spintronic device of claim 14 wherein the spin logic gate is configured to perform a NOR logic function.

* * * * *

UNITED STATES PATENT AND TRADEMARK OFFICE
CERTIFICATE OF CORRECTION

PATENT NO. : 10,134,979 B1
APPLICATION NO. : 15/631825
DATED : November 20, 2018
INVENTOR(S) : Roland K. Kawakami, Simranjeet Singh and Jyoti Katoch It is certified that error appears in the above-identified patent and that said Letters Patent is hereby corrected as shown below:

In the Specification

Column 1, Line 12 add the Government Support Clause:
--This invention was made with government support under grant number N00014-14-1-0350 awarded by the Office of Naval Research. The government has certain rights in the invention.--

Signed and Sealed this
Sixth Day of October, 2020

Andrei Iancu
*Director of the United States Patent and Trademark Office*